(12) United States Patent
White et al.

(10) Patent No.: US 7,030,647 B1
(45) Date of Patent: Apr. 18, 2006

(54) TECHNIQUES FOR CONFIGURING PROGRAMMABLE LOGIC USING ON-CHIP NONVOLATILE MEMORY

(75) Inventors: Thomas H. White, Santa Clara, CA (US); William Bradley Vest, San Jose, CA (US); Dirk Alan Reese, Campbell, CA (US); Myron Wai Wong, Fremont, CA (US)

(73) Assignee: Altera Corporation, San Jose, CA (US)

( * ) Notice: Subject to any disclaimer, the term of this patent is extended or adjusted under 35 U.S.C. 154(b) by 120 days.

(21) Appl. No.: 10/708,478

(22) Filed: Mar. 5, 2004

(51) Int. Cl.
*G06F 7/38* (2006.01)

(52) U.S. Cl. .............................. 326/38; 713/1; 713/100
(58) Field of Classification Search .................. 326/38, 326/39, 40; 713/1, 100
See application file for complete search history.

(56) References Cited

U.S. PATENT DOCUMENTS 6,219,785 B1 * 4/2001 Smith ........................... 713/1

* cited by examiner

*Primary Examiner*—Daniel D. Chang
(74) *Attorney, Agent, or Firm*—Townsend and Townsend and Crew, LLP

(57) ABSTRACT

Techniques and circuitry provide fast, accurate, proper, and reliable transfer of configuration data from an on-chip nonvolatile memory to the programmable logic core of a programmable logic integrated circuit. A first technique includes not allowing the programmable logic to be configured until the data held in the on-chip nonvolatile memory can be read correctly and reliably. A second technique includes verifying the configuration data is transferred from the nonvolatile memory to the programmable logic core correctly and without error during the transfer process. These two techniques may be combined or used individually during the configuration of an integrated circuit.

17 Claims, 6 Drawing Sheets

TECHNIQUES FOR CONFIGURING PROGRAMMABLE LOGIC USING ON-CHIP NONVOLATILE MEMORY

BACKGROUND OF INVENTION

The present invention relates to the field of integrated circuits and in particular, to an integrated circuit having a programmable logic array portion with volatile configuration memory and a nonvolatile memory array portion.

Integrated circuits are important building blocks of the modern age. Technology continues to evolve and integrated circuits continue to provide improved functionality. As integrated circuits improve, so do the electronics systems that are built using integrated circuits. There are many types of integrated circuits such as memories, microprocessors, application specific integrated circuits (ASICs), and programmable logic. Programmable logic integrated circuits such as PALS, PLDs, FPGAs, LCAs, and others are becoming more complex and continually evolving to provide more user-programmable features on a single integrated circuit.

Modern programmable logic integrated circuits incorporate programmable logic including logic gates, product terms, or look-up tables. Some programmable logic integrated circuits also include embedded user-programmable memory or RAM. However, this RAM is volatile, which means once power is removed from the integrated circuit, the contents of the RAM are lost.

Despite the success of programmable logic, there is a continuing desire to provide greater functionality in a programmable logic integrated circuit, but at the same time, provide greater performance. There is a need to provide programmable logic (configurable using volatile memory such as SRAM) with on-chip nonvolatile memory. This nonvolatile memory may be used as storage for configuration data, used to program the SRAMs upon power up of the integrated circuit.

When the integrated circuit is powered up, the voltages to the internal circuits may not be at their full operating levels. It is important that during power up of the integrated circuit, the configuration data is transferred to the programmable logic as quickly, accurately, and reliably as possible.

Therefore, there is a need to provide techniques and circuitry for ensuring the fast, accurate, proper, and reliable transfer of configuration data from an on-chip nonvolatile memory to the programmable logic core of a programmable logic integrated circuit.

SUMMARY OF INVENTION

The invention provides techniques and circuitry for ensuring the fast, accurate, proper, and reliable transfer of configuration data from an on-chip nonvolatile memory to the programmable logic core of a programmable logic integrated circuit. A first technique includes not allowing the programmable logic to be configured until the data held in the on-chip nonvolatile memory can be read correctly and reliably. A second technique includes verifying the configuration data is transferred from the nonvolatile memory to the programmable logic core correctly and without error during the transfer process. These two techniques may be combined or used individually during the configuration of an integrated circuit.

The first technique ensures that after powering up the chip, the voltages provided to the nonvolatile memory circuitry are sufficient for reading data out of the nonvolatile memory. The second technique ensures the sense amplifiers are operating properly while data is transferred. The first and second techniques may be combined in any way or may form part of a larger technique of transferring data from nonvolatile memory to programmable logic. For example, the second technique may be used after the first technique, after verifying the voltages are sufficient for reading the data out of the memory.

In a specific embodiment, the invention is a method of operating a programmable logic integrated circuit including after providing power to the integrated circuit, in a first state, reading a first pattern stored at a first address from a nonvolatile configuration memory of the programmable logic integrated circuit. Following the first state, in a second state, the first pattern is compared to an expected first pattern and returning to the first state if the first pattern does not match the expected first pattern. If the first pattern matches the expected first pattern, continuing to a third state, a second pattern stored at a second address is read from the nonvolatile configuration memory of the programmable logic integrated circuit. Following the third state, in a fourth state, the second pattern is compared to an expected second pattern and returning to the first state if the second pattern does not match the expected second pattern.

Furthermore, if the second pattern matches the expected second pattern, continuing to a fifth state, a third pattern stored at a third address is read from the nonvolatile configuration memory of the programmable logic integrated circuit. Following the fifth state, in a sixth state, the third pattern is compared to an expected third pattern and returning to the first state if the third pattern does not match the expected third pattern. If the third pattern matches the expected third pattern, continuing to a seventh state, a fourth pattern stored at a fourth address is read from the nonvolatile configuration memory of the programmable logic integrated circuit. Following the fifth state, in a sixth state, the fourth pattern is compared to an expected fourth pattern and returning to the first state if the fourth pattern does not match the expected fourth pattern. If the fourth pattern matches the expected fourth pattern, configuration of a programmable logic core of the programmable logic integrated circuit is permitted using configuration data stored in the nonvolatile configuration memory.

In another embodiment, the invention is a method of operating a programmable logic integrated circuit including after providing power to the integrated circuit, starting a timer circuit to provide a time count value. In a first state, a first pattern stored at a first address is read from a nonvolatile configuration memory of the programmable logic integrated circuit. If the time count value is a max count value, transfer of configuration data from the nonvolatile configuration memory to the programmable logic core is disabled. If the time count value is not the max count value, in a second state, the first pattern is compared to an expected first pattern and processing is returned to the first state if the first pattern does not match the expected first pattern. In short, in this embodiment, a timer is used to end the operation if a successful download does not occur by a certain amount of time.

However, in another embodiment, the device allows the circuitry to try to download or transfer the configuration to the programmable logic with no time limit if a failure keeps occurring. This means the device will attempt to configure the programmable logic in an "endless loop" as long as an error keeps occurring. Furthermore, the user may be provided with an instruction, such as a JTAG instruction provided through the JTAG interface, which disables the download. So, if the chip can't configure for some reason, it will continue to try to download forever unless the user enters a certain code into the JTAG instruction register.

In another embodiment, the invention includes a programmable logic integrated circuit with a nonvolatile configuration memory having configuration data and at least two test patterns, and a programmable logic core, connected to the nonvolatile configuration memory and having volatile memory, configured using configuration data stored in the configuration memory upon power up of the programmable logic integrated circuit. A controller circuit is connected to the nonvolatile configuration memory, having circuitry to inhibit configuration of the programmable logic core until the at least two test patterns stored in the nonvolatile configuration memory are read correctly.

In another embodiment, the invention includes a programmable logic integrated circuit including a configuration memory having configuration data stored in nonvolatile memory cells and a number of first sense amplifier circuits connected to the configuration memory. A first verification sense amplifier circuit is connected to the configuration memory. A programmable logic core is configurable to perform user functions and is connected to the plurality of first sense amplifier circuits, where the configuration data is used to configure the programmable logic core. A controller circuit is connected to the first verification sense amplifier circuit and at least one address line of a plurality of an address lines provided to the configuration memory.

In another embodiment, the invention is a method of operating a programmable logic integrated circuit including programming a nonvolatile configuration memory of the programmable logic integrated circuit with a user's configuration data and programming at least two additional bits of each word of the configuration memory where the user's configuration data is stored with bits depending on an address of the word.

In another embodiment, the invention is a method of operating a programmable logic integrated circuit including transferring in parallel a user's configuration data stored in a configuration memory to a programmable logic core of the programmable logic integrated circuit and verifying the transfer of the user's configuration data by reading and comparing at least two additional bits of each word of the parallel transfer to expected results for these two additional bits. The transfer of the user's configuration data is restarted if the at least two additional bits do not match the expected results for the two additional bits.

Other objects, features, and advantages of the present invention will become apparent upon consideration of the following detailed description and the accompanying drawings, in which like reference designations represent like features throughout the figures.

DETAILED DESCRIPTION

Figure 1:
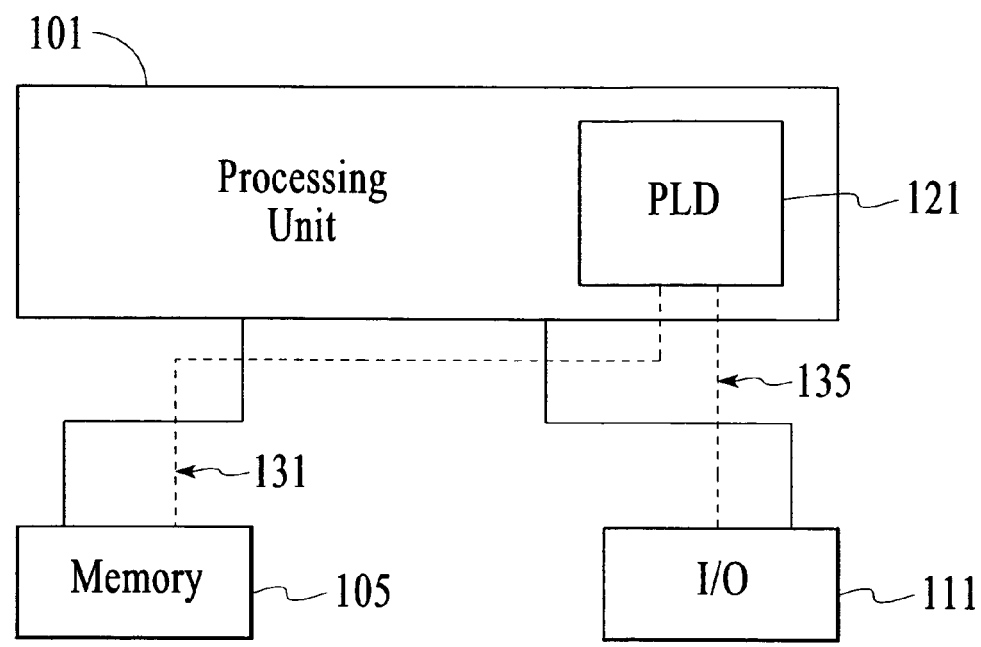
FIG. 1 is diagram of a digital system with a programmable logic integrated circuit.

FIG. 1 shows a block diagram of a digital system, within which input and output interfaces consistent with the present invention may be embodied. The system may be provided on a single board, on multiple boards, or within multiple enclosures. Though embodiments of the present invention are useful in electronic and integrated circuits in general, they are particularly useful in programmable logic devices. FIG. 1 illustrates a system 101 in which such a programmable logic device 121 may be utilized. Programmable logic devices or programmable logic integrated circuits are sometimes referred to as PALs, PLAs, FPLAs, PLDs, CPLDs, EPLDs, EEPLDs, LCAs, or FPGAs and are well-known integrated circuits that provide the advantages of fixed integrated circuits with the flexibility of custom integrated circuits. Such devices allow a user to electrically program standard, off-the-shelf logic elements to meet a user's specific needs. Examples of current programmable logic devices are represented by Altera's Classic, MAX®, Hardcopy®, FLEX®, APEX™, and STRATIX™ series of PLDs. These are described in, for example, U.S. Pat. Nos. 4,617,479, 4,871,930, 5,241,224, 5,258,668, 5,260,610, 5,260,611, 5,436,575, and the Altera Data Book (2003). Programmable logic integrated circuits and their operation are well known to those of skill in the art.

In the particular embodiment of FIG. 1, a processing unit 101 is connected to a memory 105 and an I/O 111, and incorporates a programmable logic device 121. PLD 121 may be specially coupled to memory 105 through connection 131 and to I/O 111 through connection 135. The system may be a programmed digital computer system, digital signal processing system, specialized digital switching network, or other processing system. Moreover, such systems may be designed for a wide variety of applications such as, merely by way of example, telecommunications systems, automotive systems, control systems, consumer electronics, personal computers, Internet communications and networking, wireless devices, and others.

Processing unit 101 may direct data to an appropriate system component for processing or storage, execute a program stored in memory 105 or input using I/O 111, or other similar function. Processing unit 101 may be a central processing unit (CPU), microprocessor, floating point coprocessor, graphics coprocessor, hardware controller, microcontroller, programmable logic device programmed for use as a controller, network controller, or other processing unit. Furthermore, in many embodiments, there is often no need for a CPU. For example, instead of a CPU, one or more PLDs 121 may control the logical operations of the system. In an embodiment, PLD 121 acts as a re-configurable processor, which can be reprogrammed as needed to handle a particular computing task.

Alternately, programmable logic device 121 may include a processor. In some embodiments, processing unit 101 may even be a computer system. Memory 105 may be a random access memory (RAM), read only memory (ROM), fixed or flexible disk media, PC Card flash disk memory, tape, or any other storage retrieval means, or any combination of these storage retrieval means. PLD 121 may serve many different purposes within the system in FIG. 1. PLD 121 may be a logical building block of processing unit 101, supporting its internal and external operations. PLD 121 is programmed to implement the logical functions necessary to carry on its particular role in system operation.

Figure 2:
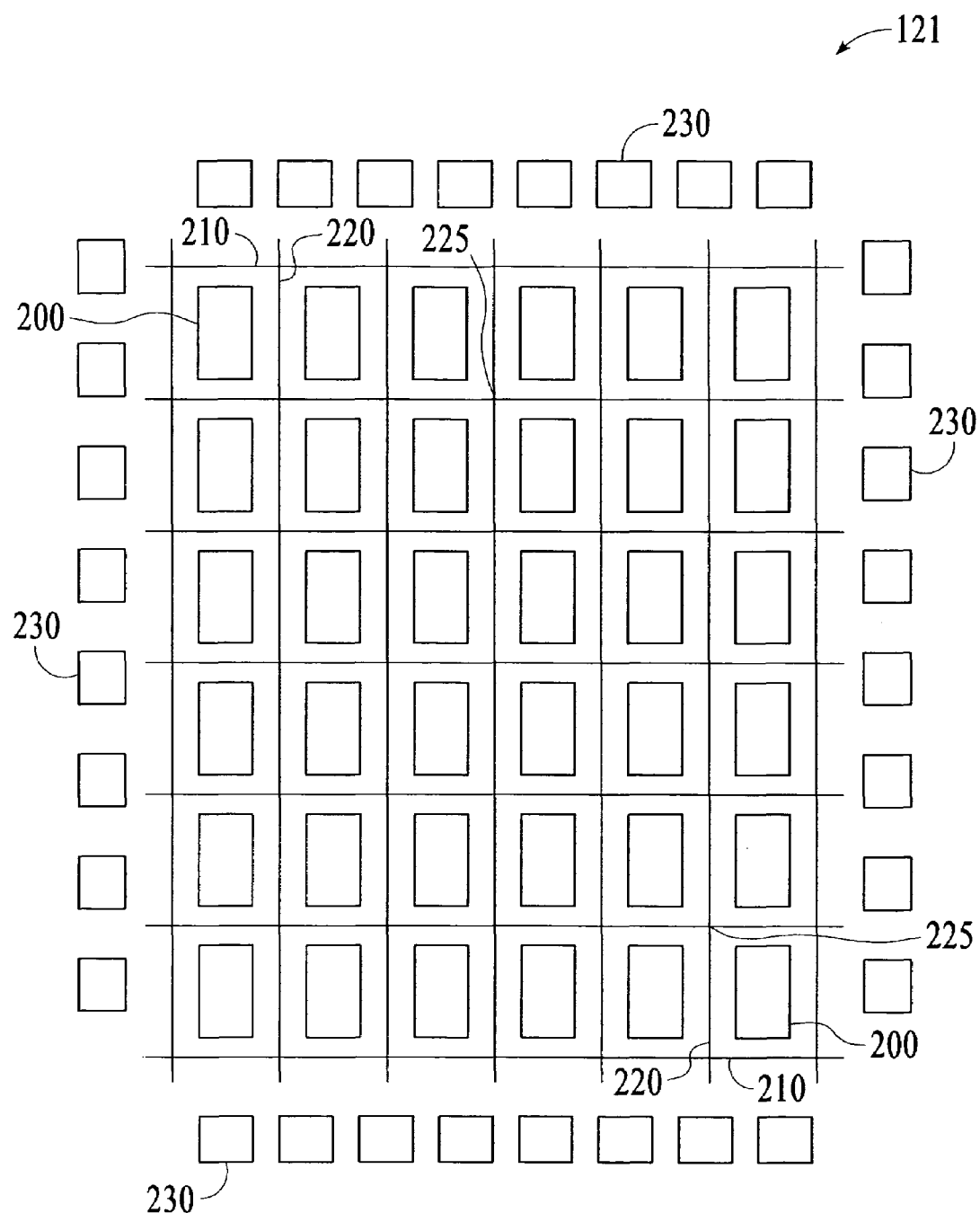
FIG. 2 is a diagram showing an architecture of a programmable logic integrated circuit.

FIG. 2 is a simplified block diagram of an overall internal architecture and organization of a PLD. Many details of programmable logic architecture, organization, and circuit design are not necessary for an understanding of the present invention and such details are not shown.

FIG. 2 shows a six-by-six two-dimensional array of thirty-six logic array blocks (LABs) 200. LAB 200 is a physically grouped set of logical resources that is configured or programmed to perform logical functions. The internal architecture of a LAB is described in more detail below. The programmable logic portion may contain any arbitrary number of LABs. Generally, in the future, as technology advances and improves, programmable logic devices with greater numbers of logic array blocks will undoubtedly be created. Furthermore, LABs 200 need not be organized in a square matrix or array; for example, the array may be organized in a five-by-seven or a twenty-by-seventy matrix of LABs.

LAB 200 has inputs and outputs (not shown), some of which may be consistent with the present invention, and which may or may not be programmably connected to a global interconnect structure, comprising an array of global horizontal interconnects (GHs) 210 and global vertical interconnects (GVs) 220. Although shown as single lines in FIG. 2, each GH 210 and GV 220 line may represent a plurality of signal conductors. The inputs and outputs of LAB 200 are programmably connectable to an adjacent GH 210 and an adjacent GV 220. Utilizing GH 210 and GV 220 interconnects, multiple LABs 200 may be connected and combined to implement larger, more complex logic functions than can be realized using a single LAB 200.

In one embodiment, GH 210 and GV 220 conductors may or may not be programmably connectable at intersections 225 of these conductors. Moreover, GH 210 and GV 220 conductors may make multiple connections to other GH 210 and GV 220 conductors. Various GH 210 and GV 220 conductors may be programmably connected together to create a signal path from a LAB 200 at one location of PLD portion 154 to another LAB 200 at another location of PLD portion 154. A signal may pass through a plurality of intersections 225. Furthermore, an output signal from one LAB 200 can be directed into the inputs of one or more LABs 200. Also, using the global interconnect, signals from a LAB 200 can be fed back into the same LAB 200. In specific embodiments of the present invention, only selected GH 210 conductors are programmably connectable to a selection of GV 220 conductors. Furthermore, in still further embodiments, GH 210 and GV 220 conductors may be specifically used for passing signal in a specific direction, such as input or output, but not both.

In other embodiments, the programmable logic integrated circuit may include special or segmented interconnect that is connected to a specific number of LABs and not necessarily an entire row or column of LABs. For example, the segmented interconnect may programmably connect two, three, four, five, or more LABs.

The programmable logic architecture in FIG. 2 further shows at the peripheries of the chip, input and output or I/O circuits 230. Input and output circuits 230 are for interfacing the PLD to external, off-chip circuitry. Some or all of these input and output circuits 230 may be consistent with embodiments of the present invention. FIG. 2 shows thirty-two input and output circuits 230; however, a programmable logic integrated circuit may contain any number of input and output circuits, more or less than the number depicted. As discussed above, some of these input-output or I/O drivers may be shared between the embedded processor and programmable logic portions. Each input and output circuit 230 is configurable for use as an input driver, output driver, or bidirectional driver. In other embodiments of a programmable logic integrated circuit, the input and output circuits may be embedded with the integrated circuit core itself. This embedded placement of the input and output circuits may be used with flip chip packaging and will minimize the parasitics of routing the signals to input and output circuits.

Figure 3:
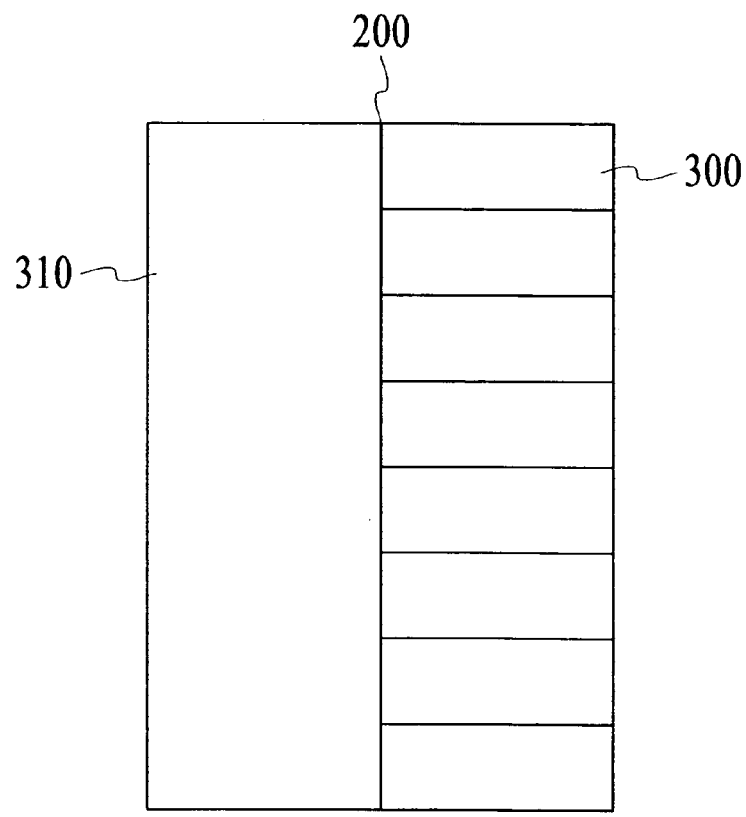
FIG. 3 is a simplified block diagram of a logic array block (LAB).

FIG. 3 shows a simplified block diagram of LAB 200 of FIG. 2. LAB 200 is comprised of a varying number of logic elements (LEs) 300, sometimes referred to as "logic cells," and a local (or internal) interconnect structure 310. LAB 200 has eight LEs 300, but LAB 200 may have any number of LEs, more or less than eight.

A general overview of LE 300 is presented here, sufficient to provide a basic understanding of the present invention. LE 300 is the smallest logical building block of a PLD. Signals external to the LAB, such as from GHs 210 and GVs 220, are programmably connected to LE 300 through local interconnect structure 310. In one embodiment, LE 300 of the present invention incorporates a function generator that is configurable to provide a logical function of a number of variables, such a four-variable Boolean operation. As well as combinatorial functions, LE 300 also provides support for sequential and registered functions using, for example, D flip-flops.

LE 300 provides combinatorial and registered outputs that are connectable to the GHs 210 and GVs 220, outside LAB 200. Furthermore, the outputs from LE 300 may be internally fed back into local interconnect structure 310; through local interconnect structure 310, an output from one LE 300 may be programmably connected to the inputs of other LEs 300, without using the global interconnect structure's GHs 210 and GVs 220. Local interconnect structure 310 allows short-distance interconnection of LEs, without utilizing the limited global resources, GHs 210 and GVs 220.

Figure 4:
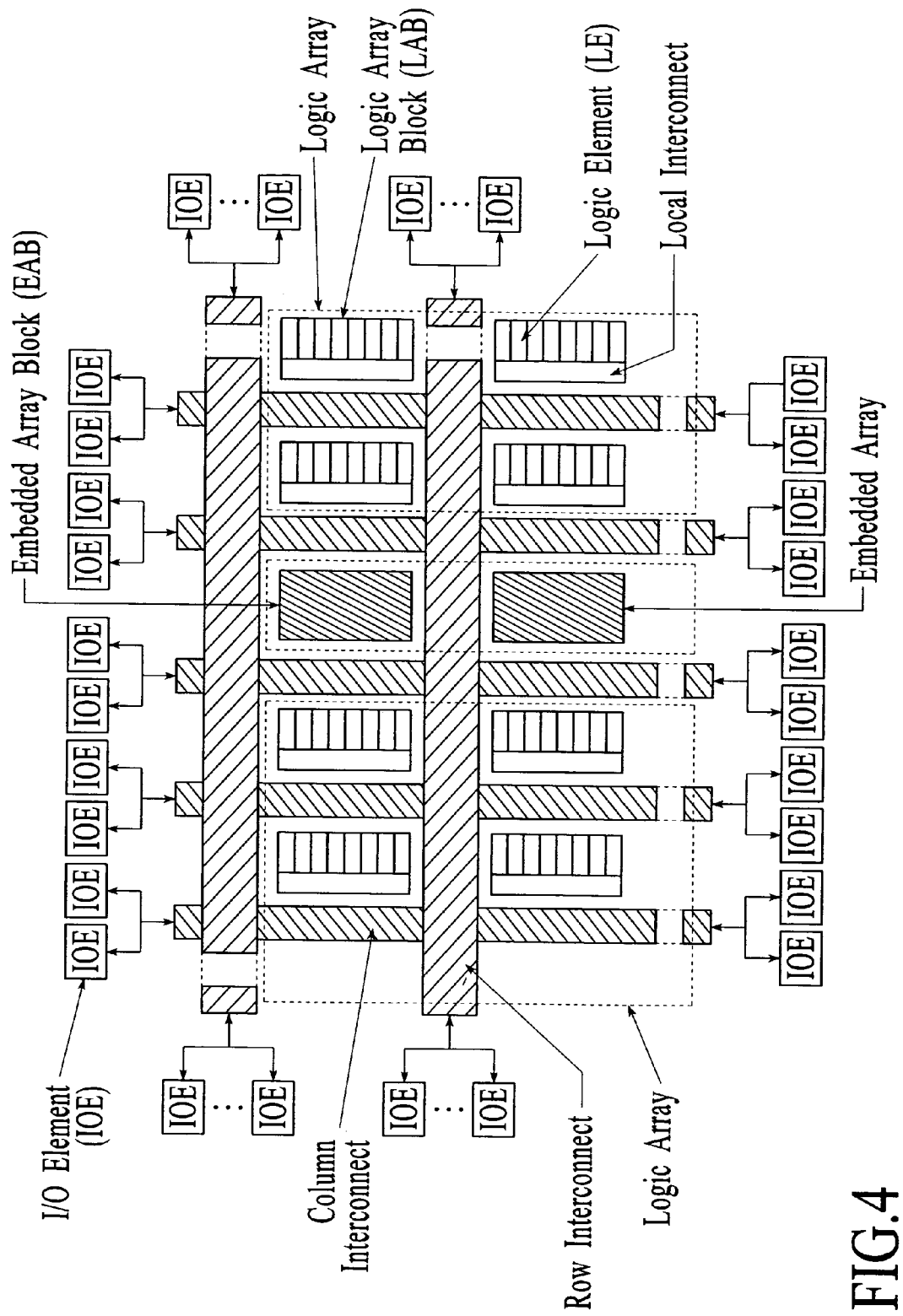
FIG. 4 shows an architecture of a programmable logic integrated circuit with embedded array blocks (EABs).

FIG. 4 shows a programmable logic architecture. The architecture in FIG. 4 further includes (small) embedded array blocks (EABs). EABs contain user memory, a flexible block of RAM. More discussion of this architecture may be found in the Altera Data Book (2003) in the description of the FLEX 10 K product family and also in U.S. Pat. No. 5,550,782. Some or all of the input-output or I/O elements may be consistent with embodiments of the present invention. The embedded array blocks can be configured as FIFOs acting as frequency translators and serial to parallel converters for interfacing between high-speed input and outputs and the core circuits including the logic array blocks. Other architectures such as Altera's APEX™ and STRATIX™ family of products are described in detail in the their respective data sheets, available via the Internet at www.altera.com.

Some programmable logic integrated circuits are configured by using on-chip nonvolatile memory cells such as EEPROM, EPROM, Flash, other floating gate or nonvolatile memory element technology, FRAM, MRAM, or polysilicon and metal fuses. Some examples of such devices are Altera's Classic, FLEXLogic, and MAX series of devices. Some integrated circuits are configured using on-chip volatile memory cells such as static RAM (SRAM) memory element technology. Some examples of such devices are Altera's FLEX and APEX series of devices.

Nonvolatile memory devices retain their configuration even when power is removed from the integrated circuit. In comparison, volatile devices lose their programming when power is removed. Therefore, for the SRAM-based and other similar devices, these programmable logic integrated circuits need to be configured on power up. One technique of programming these devices is to store the configuration information in an external or off-chip nonvolatile device such as a serial EPROM with nonvolatile memory. Upon power-up, the configuration data from the serial EPROM integrated circuit is transferred to configure the programmable logic integrated circuit. As long as power is supplied to the volatile programmable logic integrated circuit, the device will retain its programming and needs not be reprogrammed or refreshed.

Figure 5:
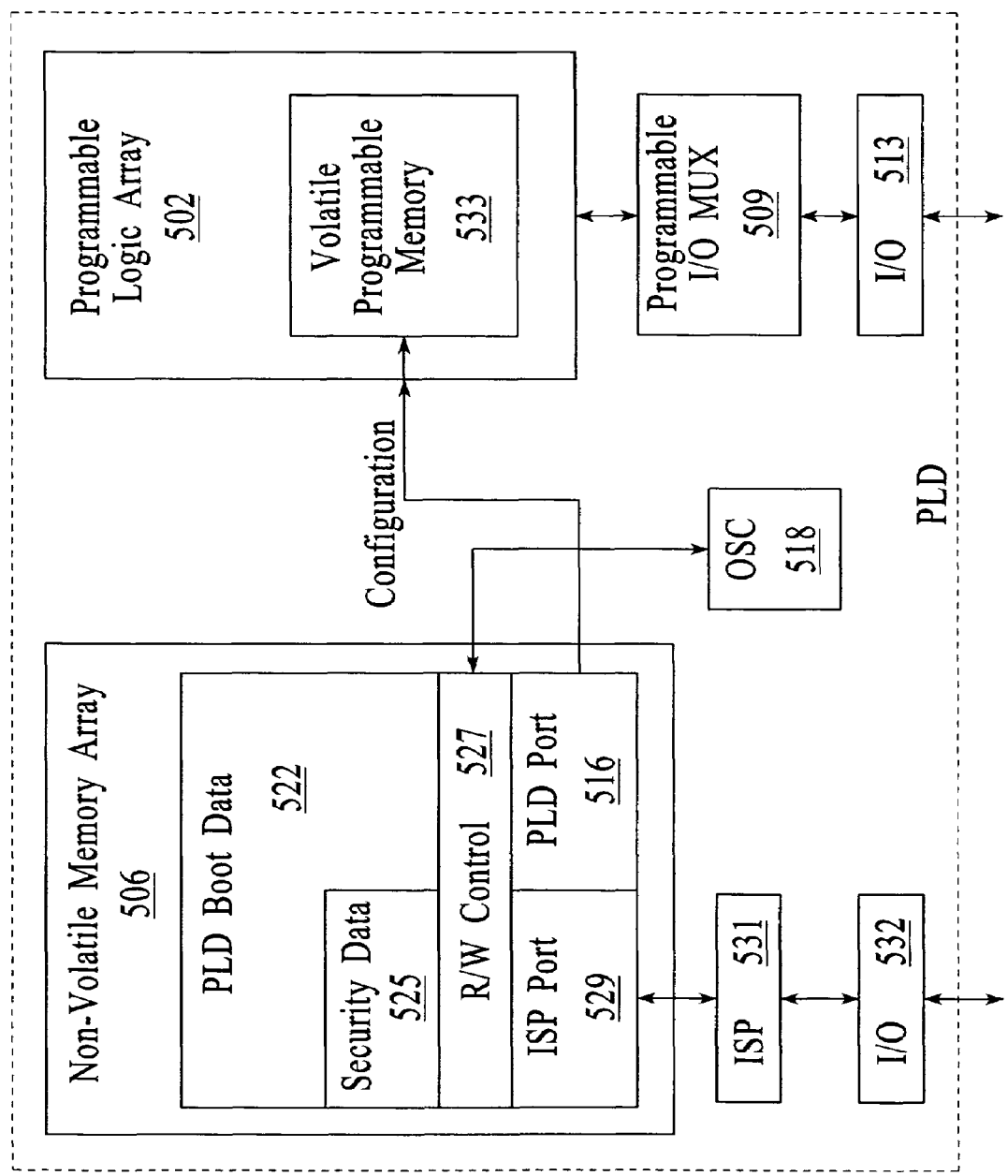
FIG. 5 shows a block diagram of a programmable logic integrated circuit with an embedded nonvolatile memory array.

FIG. 5 shows a programmable logic integrated circuit having a programmable logic array portion 502 and a nonvolatile memory array 506. Both portions reside on the same integrated circuit substrate. The programmable logic array portion uses volatile memory technology. The nonvolatile memory array has nonvolatile memory cells such as EEPROM, Flash, other floating gate or nonvolatile memory element technology, FRAM, MRAM, or polysilicon and metal fuses to store configuration information. Among possibly other uses, the configuration information in the nonvolatile memory portion is used to configure the logic of the programmable logic array portion upon power up of the integrated circuit. By having on-chip nonvolatile memory, this makes a separate nonvolatile memory integrated circuit unnecessary.

Programmable logic array 502 has inputs and outputs to a programmable I/O multiplexer or mux 509. The programmable I/O multiplexer connects selected programmable array nets to external I/O transceivers 513. The programmable logic array also has an input from a nonvolatile memory (NVM) PLD port 516. In a specific implementation, this read-only port transfers nonvolatile memory data to the volatile programmable logic array memory and its volatile programmable memory (VPM) 533 at power up. An oscillator block (OSC) 518 generates a clock for the transfer of data from the NVM to the VPM 533 at power up. The OSC has an input to enable and disable it to save power. When the oscillator is not running, power is saved.

The nonvolatile memory array has various parts: (1) PLD boot data 522 is an array of nonvolatile memory cells. (2) Security data 525 is a special set of nonvolatile bits used to disable in-system programming (ISP) read access. (3) R/W control 527 is the high voltage and analog circuits used to read and write the memory bits. (4) ISP port 529 is the digital access to the nonvolatile data. (5) PLD port 516 is a second read-only digital access to the nonvolatile data.

In a specific embodiment, the ISP and PLD access ports to the nonvolatile memory data are asymmetric. The PLD port is read only and very wide. It is wide to reduce power-up configuration time. The ISP port has a narrower word width that is more efficient for ISP programming. An ISP block 531 connects the nonvolatile memory to the ISP JTAG pins 532 for program and verify of the nonvolatile memory. The ISP block will restrict reading of the configuration data if appropriate security bits are set. This allows a user to protect and secure the user's configuration data.

Power-Up of Programmable Logic with On-Chip Configuration Memory

In some programmable logic architectures, an external memory chip is used to supply configuration data after power-up to control the internal connections and operation of the programmable logic integrated circuit. In these families, each chip, the programmable logic integrated circuit and the memory device (typically a serial EEPROM or Flash type device), has its own power detection circuit. This means that downloading or transfer of data from the memory to the programmable logic will not occur until each chip has sufficient voltage for proper operation. There may be some time delay until both chips are ready for transfer.

For devices with on-chip nonvolatile configuration memory, at power-up, data is transferred from the internal nonvolatile memory (e.g., Flash, floating gate, or electrically erasable memory cells) to the programmable logic. In particular, data from the on-chip configuration memory is transferred via the PLD port 516 to the volatile programmable memory 533 of the programmable logic array. Care must be taken that improper data is not loaded into the programmable logic core or physical damage to the programmable logic array could result. The transfer may be serial or may be parallel. In a specific embodiment, the transfer is in parallel, which is faster than a serial transfer at the same clock rate. For example, in an embodiment, the bits are transferred in parallel from the on-chip configuration memory to the programmable logic 64 bits at a time. In other implementations, the configuration may take place 1, 2, 3, 4, 5, 6, 7, 8, 9, 10, 11, 12, 14, 16, 18, 20, 24, 28, 32, 36, 38, 40, 48, or 52 bits at a time. Or the configuration may take place more than 64 bits at a time, such as 68, 72, 76, 84, 86, 96, 108, 126, 128, 136, or more bits at a time.

Furthermore, it may be desirable to program the programmable logic using the on-chip configuration memory from, in a specific example, about 200 microseconds to about 300 microseconds. In a specific implementation, there are from about 50,000 bits to about 350,000 bits or cells to configure. The number of bits depends on the size of the particular programmable logic integrated circuit. Therefore, it is important begin configuring the cells as soon as the memory is ready to be read in order to complete the task as soon as possible. This allows the user to start operating the programmable logic integrated circuit soon as power up. In other implementations, there may be more than 350,000 bits to configure, especially for very large programmable logic integrated circuits. Smaller programmable logic integrated circuits may have fewer than 50,000 bits.

The specific voltages discussed in this patent are given to provide examples. Depending on factors such as the process technology used or temperature, the specific voltages including VCC may vary. VCC voltages have been reduced over the years, and in future, for example, VCC voltages may be lower than discussed in this patent. In a specific implementation of the integrated circuit, the on-chip nonvolatile or Flash memory will operate with a VCC from about 1.1 volts to 1.5 volts, although a lower limit specified for chip operation may be about 1.71 volts. In other embodiment, the specification for a lower limit for VCC may be above 1.71 volts or below 1.71 volts. For example, the lower limit for VCC may be 1.65 volts, 1.6 volts, 1.55 volts, or 1.5 volts. The lower limit for VCC may be 1.75 volts, 1.8 volts, 1.85 volts, 1.9 volts, 2.0 volts, or 2.2 volts. By starting programming of the programmable logic before 1.71 volts, this allows the programming of the programmable logic to complete sooner.

The programmable logic integrated circuit has a power-on-reset (POR) circuit, which initiates a reset of the integrated circuit once the VCC voltage goes above a specific voltage, which may be referred to as the power-on reset or POR voltage. For example, the POR voltage may be about 0.8 volts. This means when the VCC rises to about 0.8 volts, the POR circuit will trip. Typically, the power-on reset (POR) circuit will have variations due to process and temperature changes. Therefore, the POR voltage may be above or below 0.8 volts depending on factors such as process variations or temperature. For example, the POR voltage may be 0.6 volts, 0.65 volts, 0.7 volts, 0.75 volts, 0.8 volts, 0.85 volts, or 0.9 volts. Thus, the POR voltage may be lower than the minimum operational voltage of the Flash or nonvolatile memory. For example, under some conditions, the POR voltage may be 0.8 volts, which is below the 1.1 volts or greater needed for proper operation of the nonvolatile memory.

In order to prevent erroneous operation of the nonvolatile or Flash memory, the invention provides a controller circuit to inhibit chip operation pending successful memory read. The controller circuit is on the integrated circuit (with the programmable logic and nonvolatile memory) to check the operation of the Flash memory. This controller circuit will not allow download of configuration data to the programmable logic to begin until the circuit is able to produce four expected patterns within a time allotted. In other embodiments, the controller chip may be implemented in an external chip. And in another embodiment, some or part of the controller circuitry may be implemented in user the programmable logic, while other portions are implemented on-chip or in a separate chip.

Figure 6:
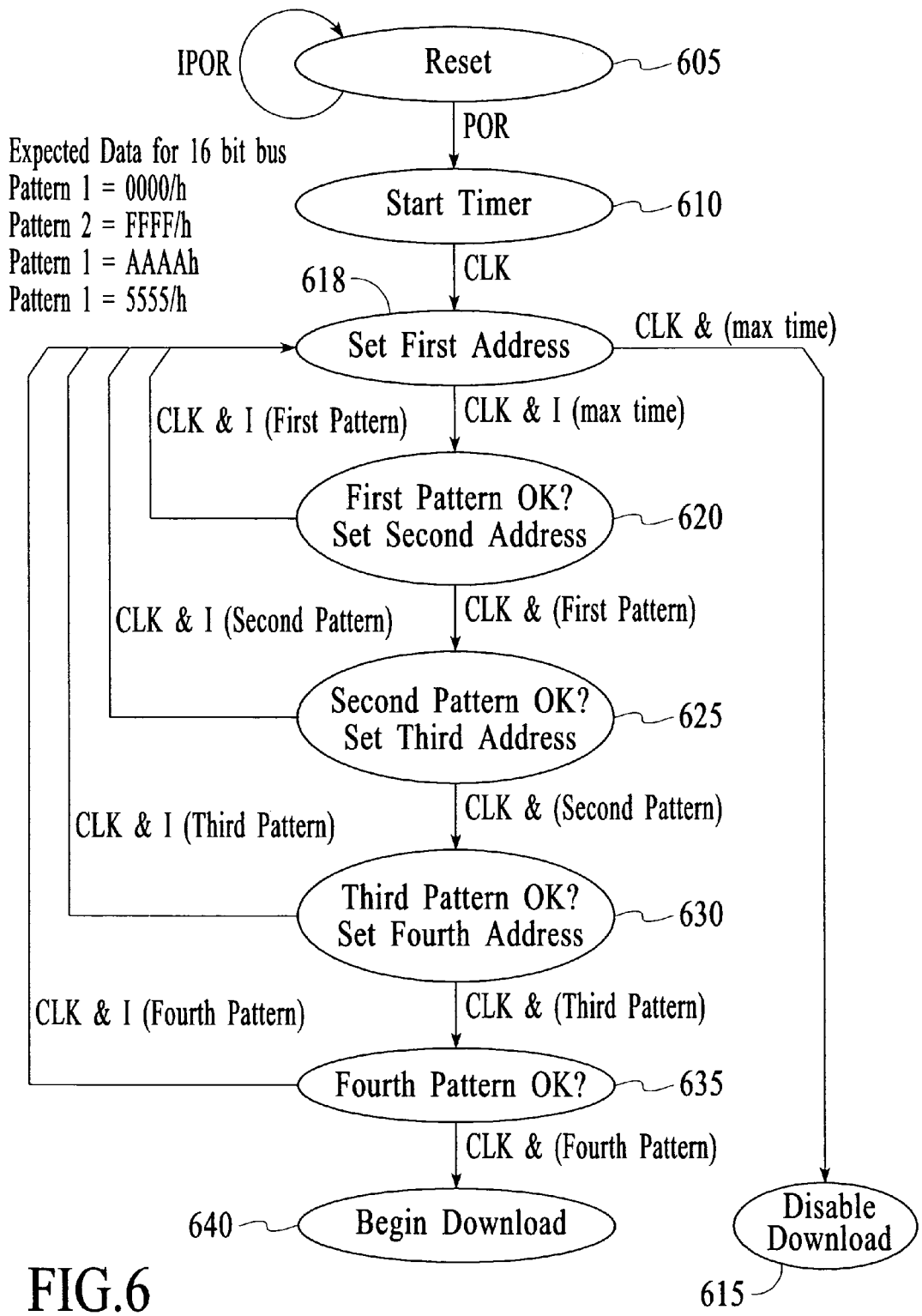
FIG. 6 shows a flow diagram of a controller of the programmable logic integrated circuit to inhibit memory operation pending successful memory read after power-on reset.

FIG. 6 shows a flow diagram of the operation of the controller. The controller starts in a step 605 and remains in step 605 until the POR circuit trips. This controller will begin operation once the POR circuit trips and proceeds to a step 610. In step 610, a timer is started. In an implementation, this timer is implemented using a counter circuit. This timer will run while the controller tries to read out some test patterns from the Flash memory.

If the timer reaches a maximum allowed time (which can be any arbitrary time value), the controller will give up trying to read out the test patterns and will power down the device (step 615). In an implementation, the maximum allotted time (i.e., max time) is about 200 microseconds. In other implementations, the allotted time may be 1 microsecond, 800 nanoseconds, 500 nanoseconds, 400 nanoseconds, 200 nanoseconds, 150 nanoseconds, 125 nanoseconds, 100 nanoseconds, 80 nanoseconds, 70 nanoseconds, or 50 nanoseconds. The max time may be less than 50 nanoseconds. The specific max time used will depend on a variety factors including the process technology, temperature, and number of cells to program.

In a specific implementation of the controller, while the timer is running, the controller will access four addresses in the Flash memory in succession (steps 618, 620, 625, and 630). Each of these addresses will have a test pattern programmed into them at the factory. The Flash memory erase circuitry will not erase the contents of these addresses during a normal customer erase cycle.

The test patterns used may be any desired bit pattern. In an implementation, the four patterns are 0000 (hex), FFFF (hex), AAAA (hex), and 5555 (hex), in this specific sequence. This sequence is used because it provides a good test of the usability of the circuitry. In particular, to switch from 0000 (hex) to FFFF (hex), all bits are switched at the same time. Specifically, the switch is from binary pattern 0000 to binary pattern 1111. And when switching from AAAA (hex) to 5555 (hex), this is switching from a 1010 binary pattern to a 0101 binary pattern, where every other bit is switched to the opposite value. By using these patterns, this ensures the circuitry is able to read the data out of the configuration memory properly.

Other pattern values may be used, and the patterns may be used in any order or stored in the addresses in any order or sequence. For example, the patterns may be in the order 5555 (hex), AAAA (hex), 0000 (hex), and FFFF (hex). Other patterns may include combinations of the above or other patterns such as F0F0 (hex), A5A5 (hex), 0505 (hex), and FAFA (hex), and there are many others.

If the controller can read out the first test pattern, all zeros, it will increment the address to the second test pattern (step 620), all ones. If the second test pattern reads correctly, the address is incremented to the third test pattern (step 625), alternating ones and zeros. If the third test pattern is read correctly, the controller increments to the address to the fourth test pattern (step 630), alternating zeros and ones. If this fourth test pattern is also read correctly (step 635), the Flash memory has sufficient voltage to operate correctly and the download begins (step 640) and the programmable logic array is configured with the configuration data stored in the nonvolatile memory.

If at any time, a test pattern is not read correctly, the address is reset to the first test pattern and the process begins again. If for some reason, the test patterns are never read out correctly by max time, in an embodiment, the timer will signal the controller to cease operation.

The reading and incrementing of addresses are performed at speed to ensure the correct functionality of the nonvolatile memory. Therefore, if the nonvolatile memory operates during normal operation at a particular frequency such as 100 MHz, then reading the test patterns out of the memory should be at this frequency to ensure the memory is fully functional. Other possible frequencies include 10, 15, 20, 25, 30, 35, 40, 50, 60, 70, 75, or 85 MHz. The frequency may be above 100 MHz, such as 150 or 200 MHz in other embodiments. Generally, at lower voltages, the circuitry will operate more slowly, or at a lower frequency. Operation of the nonvolatile memory should be inhibited until the circuitry operates at the proper frequency.

In the specific embodiment of the invention discussed above, four test patterns are stored in the memory and read out before transfer of configuration data is permitted. This number has been chosen to ensure operational reliability. However, in other embodiments of the invention, more than four test patterns may be used. This would ensure even more reliability than just four test patterns, For example, there may be 5, 6, 7, 8, 9, 16, 32, or more test patterns. And in other embodiment, there may be fewer than four test patterns, such as one, two, or three. The selection of the number of test patterns to use may depend on a number of factors such as the number of test bits (width of the nonvolatile memory), operational speed of the nonvolatile memory, process technology used, and other similar considerations.

The programming of the configuration memory with the test patterns may be at the factory before the integrated circuit is delivered to the customer, or it may be automatically performed by the software the user uses to program the configuration memory. If programmed at the factory, it is desirable that when there is an erase of the configuration, the test patterns are not erased. However, if the patterns are automatically programmed for the user, then it is important that the software continues to maintain or program the test patterns whenever there is a change to the contents of the configuration memory.

Low Voltage Read Verification

When programming programmable logic where the configuration memory is off chip, one technique to ensure the accuracy of the configuration data is to perform a cyclic redundancy check (CRC) check on the incoming data stream. The CRC check ensures the configuration information being transferred from configuration memory is error free. If there is a CRC error, the download is restarted. The data may be transferred from the configuration memory to the programmable logic integrated circuit in parallel or in series. Besides a CRC check, any other error-checking techniques and methods may be used.

When the configuration memory is on the same integrated circuit as the programmable logic, the transfer of data may also be in serial or in parallel form between the memory and the programmable logic core. However, in a specific embodiment of the invention, the transfer is in parallel form because this allows for faster transfer of data since multiple bits are being transferred at the same time. For example, in an implementation as discussed above, 64 bits are transferred at a time. Also, the timing specification for a completely internal or on-chip transfer or configuration data may typically be tighter than that where the transfer is external. This means the transfer of bits take place at a higher frequency or faster rate than a chip-to-chip transfer.

This check on the bits transferred from configuration memory to programmable logic core would occur after confirming the reading functionality of the configuration memory using a technique such as described above and provided in FIG. 6. This low voltage read verification technique may be used in connection with other techniques for verifying the functionality of the memory, other than discussed above.

In an implementation, the transfer may begin below the manufacturer's or fabrication facility's voltage specification if possible. This speeds up the transfer operation because it takes time for the power supply to ramp up upon power up. If the transfer begins before complete power-up, the transfer can start sooner. For example, the specification for stable operation the memory may be 1.71 volts, but if transfer begins at 1.1 volts, which is below the specification, this will reduce the time needed to perform the transfer.

A CRC checking scheme as in the chip-to-chip approach may be used to check the transfer from the memory portion of the chip to the programmable logic portion of the chip. However, in a specific implementation, the programmable logic integrated circuit on-chip nonvolatile memory would have data buses of up to 64-bits wide. Then the CRC circuit would be duplicated 64 times in order check the 64 streams in parallel, so as to not slow down the download. This would greatly impact die size. This would increase the cost of this feature since the CRC checker needs a certain amount of bits to hold the CRC check data. It would also delay the download to compare the CRC check data with the CRC output.

Figure 7:
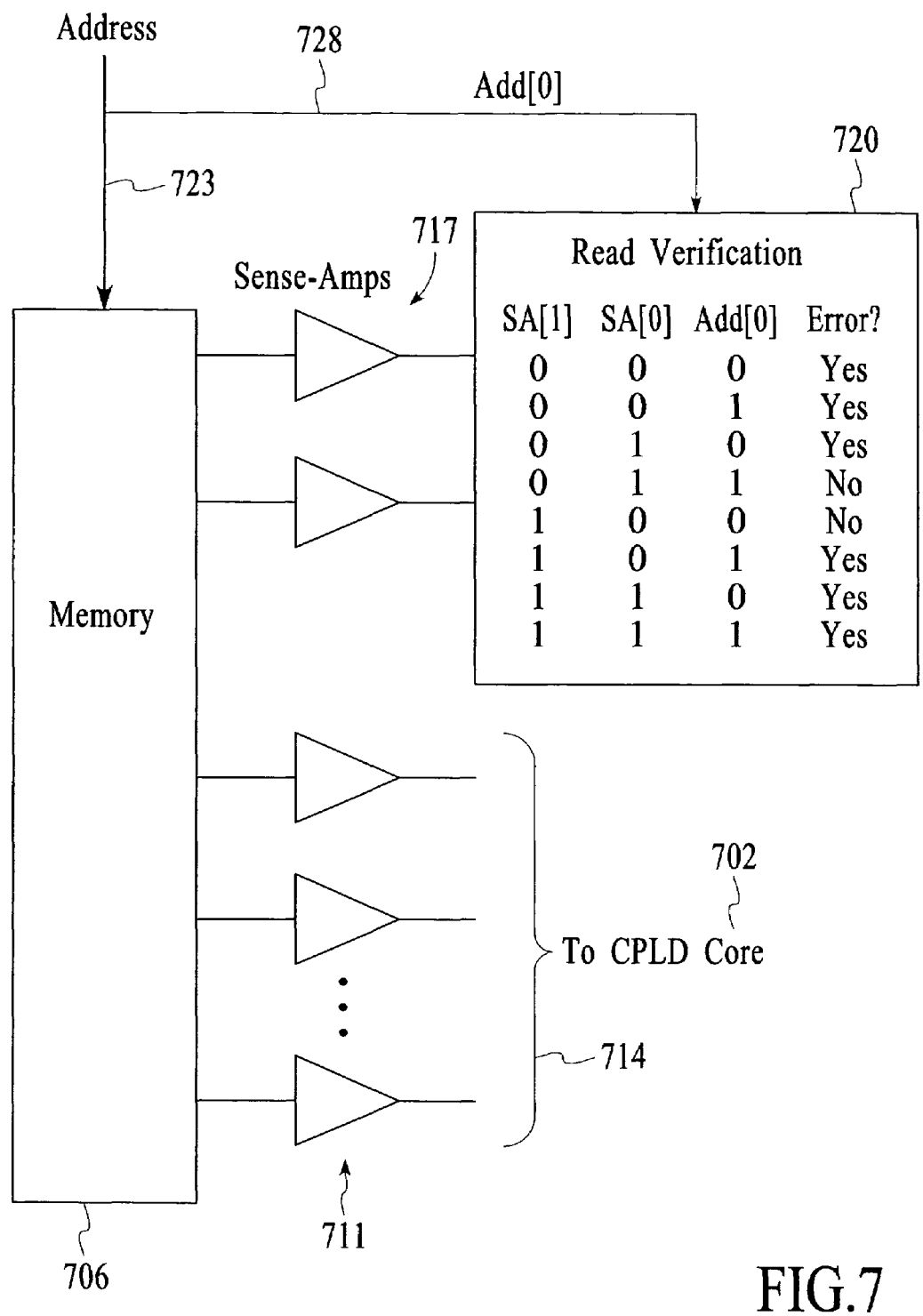
FIG. 7 shows a diagram of circuitry for verifying read of the memory bits for transfer between the configuration memory and the programmable logic core.

FIG. 7 shows circuitry for verifying the configuration bits when transferring from the on-chip memory 706 to configure the programmable logic core 702. There are a number of sense amplifier circuits 711 connected to the memory for reading the memory cells of the memory. Some of the sense amplifier circuits 714 have inputs connected to memory and outputs connected to the programmable logic core. There can be any number of sense amplifier circuits connected between the memory and programmable logic core. Generally, there is one sense amplifier for each configuration bit that is transmitted in parallel between the memory and programmable logic. Some of the sense amplifier circuits 717 are also connected between the memory and a read verification circuit block 720. An address 723 is provided to the memory and a bit 728 of the address is connected to the read verification circuit block. Typically the address is a number of bits wide, such as 5, 6, 7, 8, 10, 16, or more bits wide. The width of the address depends on the size of the memory.

In a specific implementation, the address bit is Add[0]. There are two sense amplifiers between the memory and the read verification circuit. In other implementations, there may be any number of sense amplifiers, such as one, three, four, five, six, or more. One sense amplifier will be SA[1] and the other sense amplifier will be SA[0]. The memory locations associated with SA[1] and SA[0] will be alternatively programmed for each address as 01 for odd addresses and 10 for even addresses. In other embodiments, it may be 01 for even addresses and 10 for odd addresses. This particular pattern is used because it ensures the sense amplifiers will be able to read and switch from a 0 to a 1 and from a 1 to a 0. There may also be a timing requirement for the sense amp. For example, the sense amp may need to read the data in a max time allotted, which may be typically in a range from about 30 to 50 nanoseconds.

Depending on the states of SA[1], SA[0], and Add[0], the read verification circuit will generate an error signal or other indicate an error has occurred with the configuration bit stream. A Boolean truth table is provided in block 720 and shows whether there is an error condition or not for the various states of SA[1], SA[0], and Add[0]. When an error occurs, the configuration operation will stop and the configuration operation can be restarted, or any other technique of handle an error situation may be used.

More specifically, in an implementation, the programmable logic with on-chip configuration memory will have two extra sense-amps to perform a functionality check. Each time a word of data is read out of the memory, these two sense amps will verify a one and a zero respectively. The next time a word is read out of the memory, the sensed data will be swapped and these sense-amps will need to read out a zero and a one, respectively. By swapping data every time a word is read, the ability of the sense amps to read data within the time allotted will be checked. It also checks that there is sufficient power supply voltage to read both a one and a zero.

Since the distance between sense amps connected to the memory is relatively short, it can be understood that if a sense amp can read a one, then all sense amps, including those connected to the programmable logic core, can read ones. Similarly, if a sense amp can read a zero, then all sense amps, including those connected to the programmable logic core, can read zeros.

The read verification circuit will use the address in the memory to check for either a 01 or 10 coming out of the two verification sense amps. In this specific technique, if the address is even, the sense amps will read 10. If the address is odd, the sense amps will read 01. The software used to program the on-chip memory will program ones and zeros appropriately so that this alternate read function is accomplished.

The technique discussed is merely one example of one that may be used. Besides this specific even and odd address approach, any other technique may be used to program these additional bits. For example, even addresses may be 01 and odd addresses may be 10. Or, there may be sequence of 00, 01, 10, and 11 for four addresses in a row.

If for some reason, such as a drop in power supply voltage, the sense amps do not read their correct values within a certain time limit, an error has occurred and the chip will restart the download operation. When the download has completed with no verification errors will the chip enter user operation.

There may be a specific number of times the chip will repeat attempting the download operation before shutting the chip or indicating to the user there is an error condition. For example, the chip may make three, four, five, ten, or any other number of attempts before indicating a configuration error and stopping operation. Alternatively, in an embodiment, the chip may loop indefinitely trying to load the configuration data.

The programming of the configuration memory with the additional two bits may be automatically performed by the software the user uses to program the configuration memory. It is important that the software continues to maintain or program the appropriate pattern whenever there is a change to the contents of the configuration memory. These extra bits would be invisible to the user.

This description of the invention has been presented for the purposes of illustration and description. It is not intended to be exhaustive or to limit the invention to the precise form described, and many modifications and variations are possible in light of the teaching above. The embodiments were chosen and described in order to best explain the principles of the invention and its practical applications. This description will enable others skilled in the art to best utilize and practice the invention in various embodiments and with various modifications as are suited to a particular use. The scope of the invention is defined by the following claims.

What is claimed is:

1. A method of operating a programmable logic integrated circuit comprising:
   after providing power to the integrated circuit, in a first state, reading a first pattern stored at a first address from a nonvolatile configuration memory of the programmable logic integrated circuit;
   following the first state, in a second state, comparing the first pattern to an expected first pattern and returning to the first state if the first pattern does not match the expected first pattern;
   if the first pattern matches the expected first pattern, continuing to a third state, reading a second pattern stored at a second address from the nonvolatile configuration memory of the programmable logic integrated circuit; and
   following the third state, in a fourth state, comparing the second pattern to an expected second pattern and returning to the first state if the second pattern does not match the expected second pattern.

2. The method of claim 1 further comprising:
   if the second pattern matches the expected second pattern, continuing to a fifth state, reading a third pattern stored at a third address from the nonvolatile configuration memory of the programmable logic integrated circuit; and
   following the fifth state, in a sixth state, comparing the third pattern to an expected third pattern and returning to the first state if the third pattern does not match the expected third pattern.

3. The method of claim 2 further comprising:
   if the third pattern matches the expected third pattern, continuing to a seventh state, reading a fourth pattern stored at a fourth address from the nonvolatile configuration memory of the programmable logic integrated circuit; and
   following the seventh state, in a eighth state, comparing the fourth pattern to an expected fourth pattern and returning to the first state if the fourth pattern does not match the expected fourth pattern.

4. The method of claim 3 further comprising:
   if the fourth pattern matches the expected fourth pattern, permitting configuration of a programmable logic core of the programmable logic integrated circuit using configuration data stored in the nonvolatile configuration memory.

5. The method of claim 1 wherein the expected first pattern comprises all 0s and the expected second pattern comprises all 1s.

6. The method of claim 2 wherein the expected third pattern comprises alternating 0s and 1s.

7. The method of claim 3 wherein the expected fourth pattern comprises alternating 0s and 1s.

8. The method of claim 1 further comprising:
   when erasing the nonvolatile configuration memory, preserving the first pattern stored at the first address and the second pattern stored at the second address.

9. The method of claim 1 further comprising:
   when configuring the configuration memory, programming the expected first pattern at the first address and the expected second pattern at the second address.

10. A method of operating a programmable logic integrated circuit comprising:
    after providing power to the integrated circuit, starting a timer circuit to provide a time count value;
    in a first state, reading a first pattern stored at a first address from a nonvolatile configuration memory of the programmable logic integrated circuit;
    if the time count value is a max count value, disabling transfer of configuration data from the nonvolatile configuration memory to the programmable logic core;
    if the time count value is not the max count value, in a second state, comparing the first pattern to an expected first pattern and returning to the first state if the first pattern does not match the expected first pattern;
    if the first pattern matches the expected first pattern, continuing to a third state, reading a second pattern stored at a second address from the nonvolatile configuration memory of the programmable logic integrated circuit; and
    following the third state, in a fourth state, comparing the second pattern to an expected second pattern and returning to the first state if the second pattern does not match the expected second pattern.

11. The method of claim 10 further comprising:
    if the second pattern matches the expected second pattern, continuing to a fifth state, reading a third pattern stored at a third address from the nonvolatile configuration memory of the programmable logic integrated circuit;
    following the fifth state, in a sixth state, comparing the third pattern to an expected third pattern and returning to the first state if the third pattern does not match the expected third pattern;
    if the third pattern matches the expected third pattern, continuing to a seventh state, reading a fourth pattern stored at a fourth address from the nonvolatile configuration memory of the programmable logic integrated circuit; and
    following the fifth state, in a sixth state, comparing the fourth pattern to an expected fourth pattern and returning to the first state if the fourth pattern does not match the expected fourth pattern.

12. A method of operating a programmable logic integrated circuit comprising:

transferring in parallel a user's configuration data stored in a configuration memory to a programmable logic core of the programmable logic integrated circuit;

verifying the transfer of the user's configuration data by reading and comparing at least two additional bits of each word of the parallel transfer to expected results for these two additional bits;

restarting the transfer of the user's configuration data if the at least two additional bits do not match the expected results for the two additional bits.

13. The method of claim 12 wherein the user's configuration data is transferred 64 bits in parallel.

14. The method of claim 12 further comprising:

permitting configuration of the programmable logic core when the two additional bits match the expected results for the two additional bits.

15. A method of operating a programmable logic integrated circuit comprising:

after providing power to the integrated circuit, in a first state, reading a first pattern stored at a first address from a nonvolatile configuration memory of the programmable logic integrated circuit;

following the first state, in a second state, comparing the first pattern to an expected first pattern and returning to the first state if the first pattern does not match the expected first pattern;

if the first pattern matches the expected first pattern, continuing to a third state, reading a second pattern stored at a second address from the nonvolatile configuration memory of the programmable logic integrated circuit;

following the third state, in a fourth state, comparing the second pattern to an expected second pattern and returning to the first state if the second pattern does not match the expected second pattern;

if the second pattern matches the expected second pattern, permitting configuration of a programmable logic core of the programmable logic integrated circuit using configuration data stored in the nonvolatile configuration memory;

transferring in parallel a user's configuration data stored in the configuration memory to the programmable logic core of the programmable logic integrated circuit;

verifying the transfer of the user's configuration data by reading and comparing at least two additional bits of each word of the parallel transfer to expected results for these two additional bits; and restarting the transfer of the user's configuration data if the at least two additional bits do not match the expected results for the two additional bits.

16. The method of claim 15 wherein when an address of a row where the user's configuration is stored is even, the two additional bits are 10, and when the address is odd, the two additional bits are 01.

17. The method of claim 15 wherein when an address of a row where the user's configuration is stored is even, the two additional bits are 01, and when the address is odd, the two additional bits are 10.

* * * * *

UNITED STATES PATENT AND TRADEMARK OFFICE
CERTIFICATE OF CORRECTION

| | |
|---|---|
| PATENT NO. | : 7,030,647 B1 |
| APPLICATION NO. | : 10/708478 |
| DATED | : April 18, 2006 |
| INVENTOR(S) | : White et al. |

It is certified that error appears in the above-identified patent and that said Letters Patent is hereby corrected as shown below:

Column 14, line 62, please delete "fifth" and insert --seventh--.

Column 14, line 62, please delete "sixth" and insert --eighth--.

Signed and Sealed this

Tenth Day of July, 2007

JON W. DUDAS
*Director of the United States Patent and Trademark Office*